US011357113B2

(12) United States Patent
Ren et al.

(10) Patent No.: US 11,357,113 B2
(45) Date of Patent: Jun. 7, 2022

(54) APPARATUS FOR PREPARING GRAPHENE BY MEANS OF LASER IRRADIATION IN LIQUID

(71) Applicant: Jiangsu University, Jiangsu (CN)

(72) Inventors: Xudong Ren, Jiangsu (CN); Fuhui Ma, Jiangsu (CN); Rihong Wang, Jiangsu (CN); Lei Qian, Jiangsu (CN); Wenxun Ma, Jiangsu (CN)

(73) Assignee: Jiangsu University, Zhenjiang County (CN)

( * ) Notice: Subject to any disclaimer, the term of this patent is extended or adjusted under 35 U.S.C. 154(b) by 166 days.

(21) Appl. No.: 16/476,583

(22) PCT Filed: Jul. 5, 2018

(86) PCT No.: PCT/CN2018/094585
§ 371 (c)(1),
(2) Date: Jul. 9, 2019

(87) PCT Pub. No.: WO2019/024651
PCT Pub. Date: Feb. 7, 2019

(65) Prior Publication Data
US 2019/0373735 A1    Dec. 5, 2019

(30) Foreign Application Priority Data

Jul. 31, 2017 (CN) .......................... 201710637529.8
May 23, 2018 (CN) .......................... 201810499725.8

(51) Int. Cl.
*H05K 3/00*     (2006.01)
*C01B 32/184*   (2017.01)
(Continued)

(52) U.S. Cl.
CPC .......... *H05K 3/0032* (2013.01); *B01J 19/121* (2013.01); *B05B 7/228* (2013.01); *C01B 32/184* (2017.08)

(58) Field of Classification Search
CPC .. H05K 3/0032; C01B 32/184; C01B 32/192; C01B 2204/04; B01J 19/121;
(Continued)

(56) References Cited

U.S. PATENT DOCUMENTS

2007/0003468 A1* 1/2007 Azami ...................... C09C 1/48
                                                  423/445 B
2019/0113741 A1* 4/2019 Kito ........................... G03F 7/20

FOREIGN PATENT DOCUMENTS

CN    106365151 A    2/2017
CN    106458600 A    2/2017
CN    107416799 A    12/2017

OTHER PUBLICATIONS

International Search Report for International Application No. PCT/CN2018/094575, dated Sep. 14, 2018, (4 pages).

* cited by examiner

*Primary Examiner* — Xiuyu Tai
(74) *Attorney, Agent, or Firm* — Hartman Global IP Law; Gary M. Hartman; Domenica N. S. Hartman (57) ABSTRACT

An apparatus for preparing graphene by means of laser irradiation in liquid, comprising a laser generating system, and further comprising a computer control system, a cleaning and drying system, and a workpiece auxiliary system. The light spot diameter of the laser emitted from a pulse laser unit (26) is increased by means of a beam expander (24), and the laser is reflected and split by a beam splitter to form two laser beams; a first laser beam (19) shocks the right vertical plane of a graphite solid target (18) by means of a focusing lens, and a second laser beam (17) shocks the left (Continued)

vertical plane of the graphite solid target (18) by means of the focusing lens, so as to grow graphene on a copper foil (5) substrate.

10 Claims, 4 Drawing Sheets

(51) Int. Cl.
  *B05B 7/22* (2006.01)
  *B01J 19/12* (2006.01)
(58) Field of Classification Search
  CPC . B05B 7/228; H01L 51/0027; H01L 51/5234; H01L 51/56; H01L 51/5206; H01L 51/0021; H01L 51/5203; H01L 2251/558; C01P 2006/40
  See application file for complete search history.

APPARATUS FOR PREPARING GRAPHENE BY MEANS OF LASER IRRADIATION IN LIQUID

TECHNICAL FIELD

The invention includes a device for preparing graphene by liquid-phase pulsed laser ablation, which is related to automatic multi-system coordinated work operation.

BACKGROUND TECHNOLOGY

The laser irradiates the material in an aqueous solution, which generates gas plasma plumes composed of neutral carbon atoms, carbon ions, free radicals and hydrogen, and oxygen ions instantaneously. After a series of complex photothermal changes, the plasma plume rapidly expands around to generate a high-pressure shock front, which induces a plasma shock wave. The strong shock wave has big momentum to move a few graphene segments out of graphite. The bubble containing graphene segments expand outward at high speed. With the intervention of the solid-liquid interface, the bubble has a pressure difference between the two sides. The high-pressure region of the vacuole wall is deformed and depressed, finally forming a micro jet towards the solid surface 30. After the cooling process, hundreds of nanometer-sized carbon layer segments form amorphous carbon clusters and graphene layers on the surface of the Cu foil.

The synthesis of few-layer graphene has inspired extensive research due to their novel properties and diversity in functionalization for various applications, including materials science, micro-Nano processing, energy, biomedicine and drug delivery, etc. Several exfoliation methods, such as micromechanical exfoliation, chemical exfoliation, liquid-phase ultrasonic exfoliation, epitaxial growth on the substrate and laser exfoliation, have been employed to obtain graphene from graphite. Among these methods, mechanical exfoliation can avoid damage to the sp2 structure to produce the highest quality graphene. However, the mechanical exfoliation method is not suitable for mass production, due to the glue it leaves on the samples surface and also causes secondary pollution of graphene.

Recently, liquid-phase pulsed laser ablation method has gained much attention in preparation of graphene or graphene nanoribbons for its numerous advantages. Lu reported the production of few-layer graphene through laser exfoliation of highly ordered pyrolytic graphite (HOPG) in liquid, which presented a new and efficient way to synthesize carbon nanomaterials. However, the preparation of graphene directly in the suspension requires subsequent separation and purification, resulting in lower yields. Only a few products are separated, most of them cannot be collected effectively. Therefore, it is necessary to explore a method to achieve efficient conversion of carbon materials into graphene in a liquid medium.

After consulting the relevant literature, the existing device for preparing graphene by laser irradiation still has many shortcomings, such as lacking of flexibility and stability. In addition, they are not automated, systematic, which is not conducive to the continuity and effectiveness of the experiment.

SUMMARY OF THE INVENTION

The object of the present invention is to provide a device for preparing graphene by liquid-phase pulsed laser ablation, which can facilitate the study of the phase change process of carbon material in a laser impact liquid medium. It has a simple process, low equipment cost and high material utilization rate. More importantly, the device provides a basic guarantee for the industrial application of graphene.

A device for preparing graphene by liquid-phase pulsed laser ablation is characterized in that it comprises a moving platform and a reaction chamber which is arranged on the moving platform. The deionized water is loaded into the reaction chamber, and a graphite solid target is located in a deionized aqueous solution in the reaction chamber. The third rotating shaft and the second rotating shaft are disposed between one side of the graphite solid target and an inner wall surface of the reaction chamber. The third rotating shaft and the second rotating shaft are disposed between the wall surfaces, and the second rotating shaft is located above the deionized water solution in the reaction chamber, the third rotation shaft is located in the deionized water solution directly below the second rotating shaft, the first rotating shaft is also arranged on the plane where the second rotating shaft is located, the third a second copper foil is wound around the rotating shaft. The second copper foil is wound on the third rotating shaft, and the second copper foil is wound on the first rotating shaft after passing through the second rotating shaft. A pulse laser device is disposed above the reaction chamber.

In the above scheme, the fourth rotating shaft and the fifth rotating shaft are arranged between the other side of the graphite solid target and the inner wall of the reaction chamber. The fifth rotating shaft is located above the deionized water solution in the reaction chamber, and the fourth rotating shaft is located in the deionized water solution directly below the fifth rotating shaft. The sixth rotating shaft is arranged on the plane where the fifth rotating shaft is located. The first copper foil is wound on the fourth rotating shaft, and the first copper foil is wound on the sixth rotating shaft after passing through the fifth rotating shaft. The laser emitted by the pulsed laser device expands the diameter of the spot through the beam expander and reflects the light through the beam splitter to generate the first laser beam and the second laser beam. The first laser beam focused by a focusing lens ablates onto a façade of one side of the graphite solid target, and the second laser beam passes through a focusing lens ablates on the façade of the other side of the graphite solid target in the deionized water.

In the above scheme, the two rows of racks are fixed on the bottom surface of the reaction chamber, and the two rows of racks are connected by the constraint plate. The graphite solid target is constrained by the constraint plate. Each of the racks is provided with two meshing plates, and the graphite solid target is located in the middle of the four meshing plates. Two ends of the third rotating shaft, the second rotating shaft, the fourth rotating shaft, and the fifth rotating shaft are correspondingly mounted on two rows of racks on the meshing plate.

In the above scheme, the reaction chamber is located in collection chamber, and the collection chamber is located on the moving platform. The water inlet of the circulating electric pump is connected to the bottom of the collecting chamber, and the water outlet of the circulating electric pump is connected to the middle of the reaction chamber. The outlet pipe of circulating electric pump is provided with a liquid storage tank and a flow meter.

In the above scheme, the first motor and the second motor are installed on the first rotating shaft and the sixth rotating shaft, respectively. The first motor, the second motor, the circulating electric pump, the moving platform and the flow meter are connected with a digital controller. The digital controller and the pulsed laser device are connected to a computer.

In the above scheme, four magnets are disposed between the collection chamber and the reaction chamber, and the graphite solid target is located in the middle of the four magnets.

In the above scheme, the second roller shaft is disposed below the first rotating shaft, and the first roller shaft is disposed on a horizontal surface of the second roller shaft. The seventh rotating shaft is disposed above the first roller shaft. The second copper foil is wound on the seventh rotating shaft, sequentially passing through the third rotating shaft, the second rotating shaft, the first rotating shaft, the second roller shaft and the first roller shaft. a plurality of air nozzles is disposed on the right side of the second copper foil, which is located between the first roller shaft and the seventh rotating shaft. A plurality of liquid nozzles is disposed above the second copper foil, which is located with between the first roller shaft and the second roller shaft.

In the above scheme, the fourth rotating shaft and the fifth rotating shaft are disposed between the other side of the graphite solid target and the inner wall of the reaction chamber. The fifth rotating shaft is located above the deionized water solution in the reaction chamber, and the fourth rotating shaft is located in the deionized water solution directly below the fifth rotating shaft. The sixth rotating shaft is disposed on a plane where the fifth rotating shaft is located, and a third roller shaft is disposed below the sixth rotating shaft. The fourth roller shaft is disposed on a horizontal plane of the third roller shaft, and the eighth rotating shaft is disposed above the fourth roller shaft. The first copper foil is wound on the fourth rotating shaft. The first copper foil is wound on the eighth rotating shaft, sequentially passing through the fourth rotating shaft, the fifth rotating shaft, the sixth rotating shaft, the third roller shaft and the fourth roller shaft. A plurality of liquid nozzles is disposed above the first copper foil, which is located between the third roller shaft and the fourth roller shaft. a plurality of air nozzles is disposed on the left side of the first copper foil, which is located between the eighth rotating shaft and the fourth roller shaft. The laser emitted by the pulsed laser device expands the diameter of the spot through the beam expander and reflects the light through the beam splitter to generate the first laser beam and the second laser beam. The first laser beam focused by a focusing lens ablates onto a façade of one side of the graphite solid target, and the second laser beam passes through a focusing lens ablates on the façade of the other side of the graphite solid target in the deionized water.

In the above scheme, it also includes the first reservoir, the second reservoir, the second solenoid valve, the first solenoid valve, a water pump, a nitrogen bottle, and a throttle meter. The first reservoir and the second reservoir are connected to the water pump through the second electromagnetic valve. The nitrogen bottle is connected to the throttle meter through the first solenoid valve, and the liquid nozzle is mounted on an output line of the water pump, the gas nozzle is mounted on the output gas line of the throttle meter.

In the above scheme, the fourth motor is mounted on the eighth rotating shaft, and the third motor is disposed on the seventh rotating shaft. The third motor, the fourth motor, the second solenoid valve, the first solenoid valve, and a water pump, the moving platform and the throttle meter are all connected to a digital controller, and the digital controller and the pulsed laser device are connected to the computer.

The advantages of the invention: (1) It overcomes the problem of low efficiency, difficulty in installation control, and cumbersome operation in preparing graphene by laser liquid phase irradiation. The device is flexible and easy to change under the premise of ensuring stability. (2) The laser generated by the high-power pulsed laser device is expanded by the beam expander, and then the laser beam split by the beam splitter ablates the left and right façades of the graphite solid target to generate more plasma than the single beam, which greatly increases the efficiency of graphene preparation and the utilization of graphite solid targets. (3) The moving plasma is subjected to the Lorentz force and the circulating deionized water in the magnetic field, which accelerates the contact between graphene and copper foil and promotes the deposition growth of graphene on the copper foil. (4) The system and automation of the above systems are connected with the computer and the digital controller, which saves time and ensures the accuracy and continuity of the experiment. (5) The support device and the constraint device can be adjusted according to different experiments, which expands the scope of the use of the device, and the collection chamber is arranged outside the reaction chamber to avoid contamination of the experimental platform by the splash droplets. (6) The power density of the first laser beam and the second laser beam emitted by the pulsed laser device can be set to different values to verify the effect of different power densities of the laser on the efficiency of preparing the graphene and save the time of the contrast experiment.

In the figure: 1. Magnet; 2. Constraint plate; 3. Water inlet; 4. The third rotating shaft; 5. The second copper foil; 6. The first supporting plate; 7. Moving platform; 8. Collection chamber; 9. Reaction chamber; 10. The first motor; 11. The first rotating shaft; 12. Full mirror; 13. The second rotating shaft; 14. Laser head; 15. Focusing lens; 16. Lens protector; 17. The second laser beam; 18. Graphite solid target; 19. The first laser beam; 20. Spectroscope; 21. The fifth rotating shaft; 22. The first copper foil; 23. The sixth rotating shaft; 24. Extender lens; 25. Laser; 26. Pulsed laser device; 27. Computer; 28. Digital controller; 29. Circulating electric pump; 30. Liquid storage tank; 31. Flow meter; 32. Outlet; 33. The second motor; 34. Water outlet pipe; 35. Racks; 36. Meshing plate; 37. The fourth rotating shaft; 38. The first reservoir; 39. The second reservoir; 40. The fourth roller shaft; 41. The second roller shaft; 42. The first roller shaft; 43. Nitrogen bottle; 44. The first solenoid valve; 45. the throttle meter; 46. The seventh roller shaft; 47. Air nozzles; 48. Liquid nozzles; 49. The third roller shaft; 50. The eighth rotating shaft; 51. Water pump; 52. The second solenoid valve; 53. The third motor; 54. The fourth motor; 55. The second supporting plate.

Concrete Implementing Ways

Figure 1:
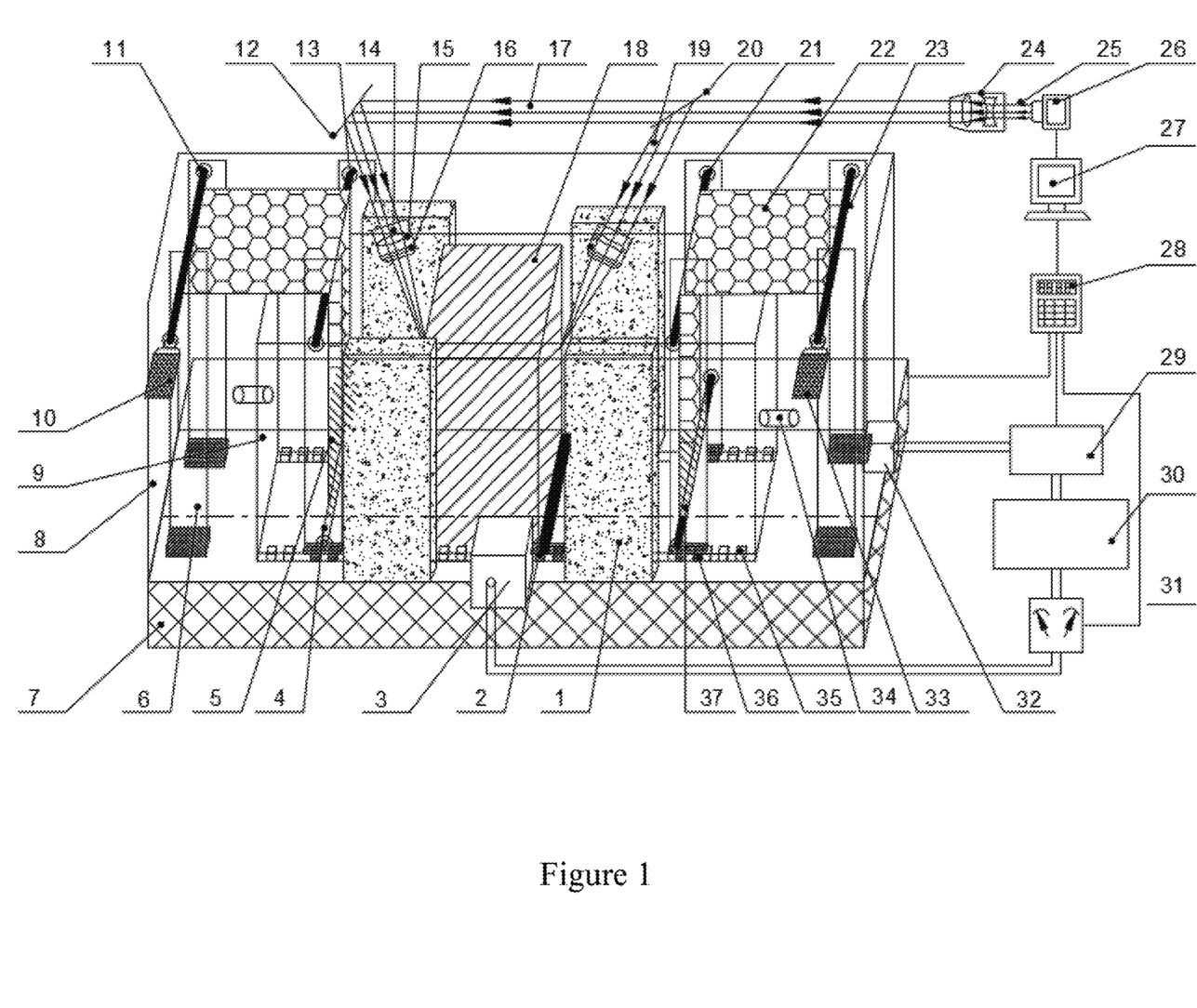
FIG. 1. Invention setup for preparing graphene by liquid-phase pulsed laser ablation.
Figure 3:
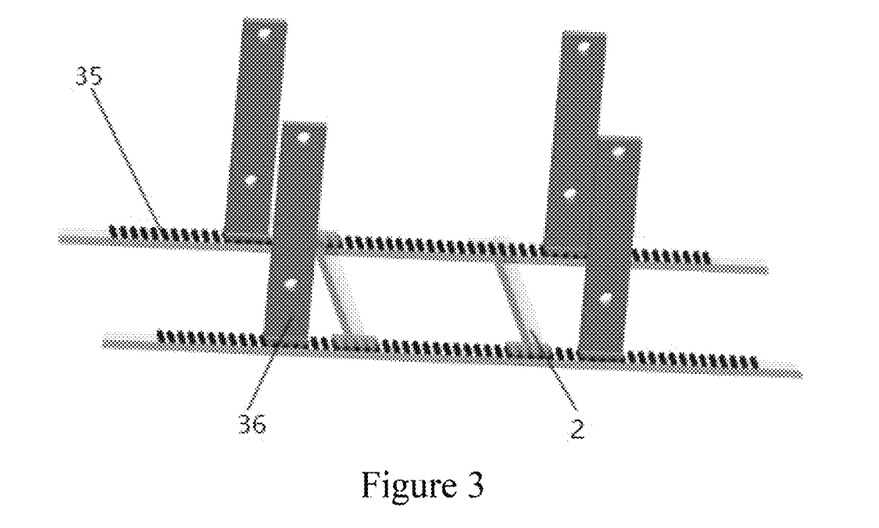
FIG. 3. Schematic diagram of the rack device, the supporting device and the restraining device.

Implementation case 1: As shown in FIG. 1, the device for preparing graphene by liquid-phase pulsed laser ablation in the embodiment includes a laser generation system and a reaction vessel located under the laser generating system. The reaction vessel is composed of a reaction chamber 9 and a collection chamber 8, which is outside the reaction chamber 9. The reaction chamber 9 is located on the moving platform 7, and the reaction chamber 9 is filled with deionized water. Two rows of racks 35 are fixed on the bottom of the reaction chamber 9 and are meshed with the meshing teeth 36. The two rows of racks 35 are connected by the constraint plate 2. A graphite solid target 18 is disposed in the middle of the reaction chamber 9, and a laser head 14 is disposed between the right and left vertical surfaces of the graphite solid target 18 and the spectroscope 20 and the full mirror 12, respectively. A focusing lens 15 and a lens protector 16 are sequentially disposed on the laser head 14. As shown in FIG. 3, the graphite solid target 18 is fixed to the racks 35 by the constraint plate 2. The third rotating shaft 4, the second rotating shaft 13, the fourth rotating shaft 37, and the fifth rotating shaft 21 are symmetrically disposed on the meshing plate 36. The second rotating shaft 13 is located above the deionized water solution in the reaction chamber 9, and the third rotating shaft 4 is located in the deionized water solution directly below the second rotating shaft 13. The first rotating shaft 11 is also arranged on the plane where the second rotating shaft 13 is located, and the first rotating shaft 11 is located above the first supporting plate 6. The first motor 10 is installed on the first rotating shaft 11, and the second copper foil 5 is wound on the third rotating shaft 4. The second copper foil 5 is wound on the first rotating shaft 11 after passing through the second rotating shaft 13 under the driving of the first motor 10. The fifth rotating shaft 21 is located above the deionized water solution in the reaction chamber 9, and the fourth rotating shaft 37 is located in the deionized water solution directly below the fifth rotating shaft 21. The sixth rotating shaft 23 is also arranged on the plane where the fifth rotating shaft 21 is located, and the sixth rotating shaft 23 is located above the first supporting plate 6. The second motor 33 is installed on the sixth rotating shaft 23, and the first copper foil 22 is wound on the fourth rotating shaft 37. The first copper foil 22 is wound on the sixth rotating shaft 23 after passing through the fifth rotating shaft 21 under the driving of the second motor 23. The first copper foil 22 and the second copper foil 5 are changed the moving direction through the fifth rotating shaft 21 and the second rotating shaft 13, respectively. The meshing plate 36 with copper foil can adjust the distance to graphite solid target 18 by changing the engagement position on rack 35 as required. Four magnets 1 are disposed between the collection chamber 8 and the reaction chamber 9 to provide a stable magnetic field. The moving carbon plasma is subjected to upward Lorentz force under the action of the magnetic field, which can adjust the direction of movement of the plasma, so that the graphite is in contact with the copper foil as much as possible in the horizontal direction, making the graphene deposited on the copper foil as even as possible. The depth of the deionized water solution is slightly higher than the height of the graphite solid target 18. The reaction chamber 9 and the collection chamber 8 are connected through the water outlet pipe 34. A pulsed laser device 26 is disposed above the reaction chamber, and an extender lens 24 is disposed between the pulsed laser device 26 and the spectroscope 20. The laser 25 emitted by the pulsed laser device 26 expands the diameter of the spot through the beam expander 24 and reflects the light through the beam splitter 20 to generate the first laser beam 19 and the second laser beam 17. The first laser beam 19 focused by a focusing lens 15 ablates onto a façade of one side of the graphite solid target 18, and the second laser beam 17 passes through a focusing lens 15 ablates on the façade of the other side of the graphite solid target 18 in the deionized water. The circulating electric pump 29 is installed outside the reaction chamber, and the water inlet 3 of the circulating electric pump 29 is connected to the bottom of the collecting chamber 8, and the water outlet 32 of the circulating electric pump 29 is connected to the middle of the reaction chamber 9. The liquid storage tank 30 and the flow meter 31 are disposed on the water outlet pipe of the circulating electric pump 29. The first motor 10, the second motor 33, the circulating electric pump 29, the moving platform 7 and the flow meter 31 are connected with a digital controller 28. The digital controller 28 and the pulsed laser device 26 are connected to a computer 27.

Figure 4:
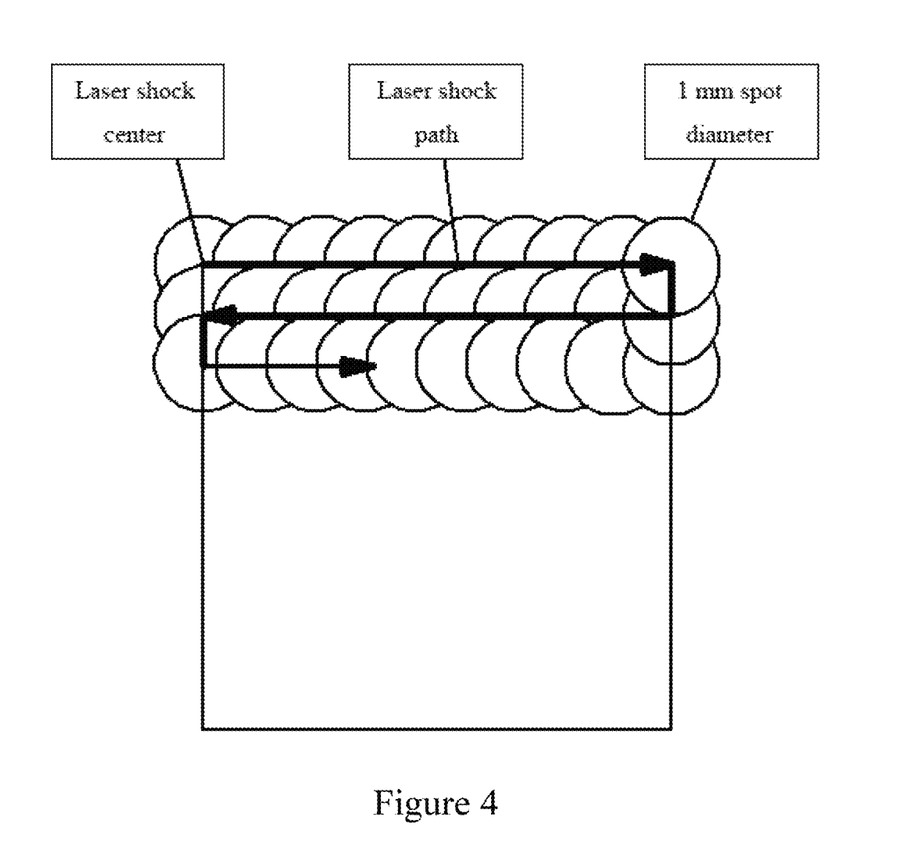
FIG. 4. The laser scan path.

Firstly, the method for preparing graphene by the above device is to place a commercial highly ordered pyrolytic graphite (HOPG) 18 having a purity of 99.99% in the middle of the reaction chamber 9. Fixing by the constraint plate 2 while adjusting the meshing plate 36, so that the distance between the left and right sides of the first copper foil 22 and the second copper foil 5 and the graphite solid target 18 is a predetermined value satisfying the condition. At the same time, four N52 NdFeB magnets 1 are symmetrically placed on the front and rear sides of the reaction chamber 9 and the collection chamber 8, respectively. Then, turn on the circulating electric pump 29, and inject deionized water into the reaction chamber so that the deionized water level is slightly higher than the graphite solid target 18. The circulating flow rate of deionized water under the action of the circulating electric pump 29 is 0.4 to 0.8 ml/s. Turn on the pulsed laser device 26, and the laser parameters (laser energy=0.6 J wavelength=532 nm, $\tau$=7 ns) with a spot diameter of 1 mm are set by the computer 27. In addition, the power density of the first laser beam and the second laser beam are both $3.82 \times 10^9$ W/cm$^2$. The laser shock time is a predetermined time, and the position of the laser head 14 is adjusted so that the laser focus is respectively located on the left and right sides of the graphite solid target 18, which is lower than the liquid surface. According to the laser scan path shown in FIG. 4, the relative movement time of the laser in the adjacent two impact center points was set to 0.1 s, so the moving speed of the three-dimensional moving platform in the horizontal direction was set to 0.005 m/s, which ensure that each point was ablated by 10 pulses. When the laser scanned to the boundary of the graphite solid target 18, the first motor 10 and the second motor 33 drive the copper foil to rotate a predetermined distance while the moving platform moves in the reverse direction until the shock time is 75 min. Then, turn off all devices, and the copper foil is removed for subsequent graphene purification and transfer processing. Preferably, the deionized water has a circulating flow velocity of 0.4-0.8 ml/s under the action of a circulating electric pump. Furthermore, the power density of the first laser beam and the second laser beam emitted by the pulsed laser device may be set to different values, so that compare and verify the effects of different power densities of the laser on the efficiency of preparing graphene, and save time for comparison experiments.

Figure 2:
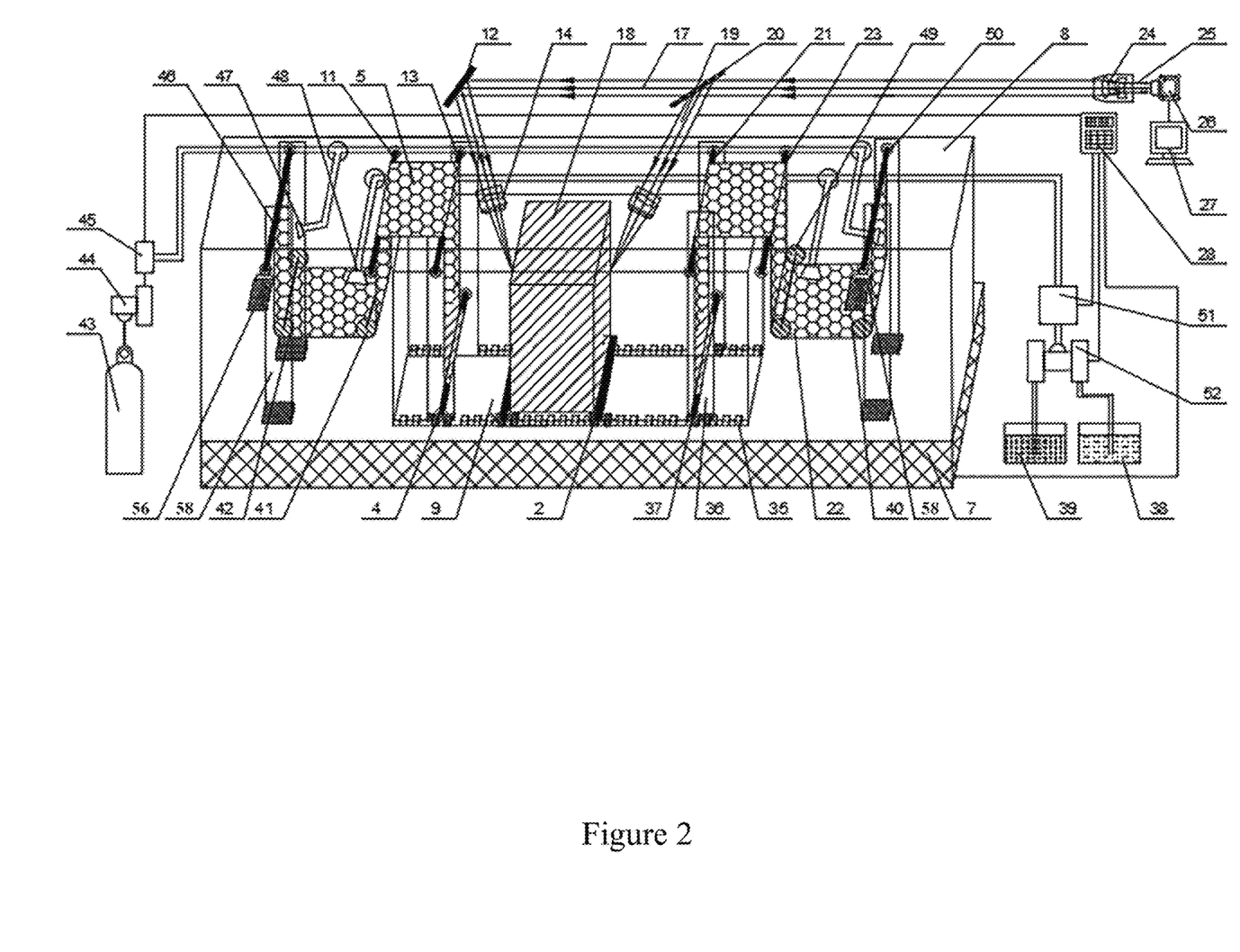
FIG. 2. Schematic diagram of derivative structure device.

Implementation case 2: As shown in FIG. 2, the device for preparing graphene by liquid-phase pulsed laser ablation in the embodiment includes a laser generation system and a reaction vessel located under the laser generating system. The reaction vessel is composed of a reaction chamber 9 and a collection chamber 8, which is outside the reaction chamber 9. The reaction chamber 9 is located on the moving platform 7, and the reaction chamber 9 is filled with deionized water. Two rows of racks 35 are fixed on the bottom of the reaction chamber 9 and are meshed with the meshing teeth 36. The two rows of racks 35 are connected by the constraint plate 2. A graphite solid target 18 is disposed in the middle of the reaction chamber 9, and a laser head 14 is disposed between the right and left vertical surfaces of the graphite solid target 18 and the spectroscope 20 and the full mirror 12, respectively. A focusing lens 15 and a lens protector 16 are sequentially disposed on the laser head 14. As shown in FIG. 3, the graphite solid target 18 is fixed to the racks 35 by the constraint plate 2. The third rotating shaft 4, the second rotating shaft 13, the fourth rotating shaft 37, and the fifth rotating shaft 21 are symmetrically disposed on the meshing plate 36. The second rotating shaft 13 is located above the deionized water solution in the reaction chamber 9, and the third rotating shaft 4 is located in the deionized water solution directly below the second rotating shaft 13. The first rotating shaft 11 is also arranged on the plane where the second rotating shaft 13 is located. The second roller shaft 41 is disposed below the first rotating shaft 11, and the seventh rotating shaft 46 is disposed on a left side of the first rotating shaft 11 in the horizontal direction. The first roller shaft 42 is disposed below the seventh rotating shaft 46, and the seventh rotating shaft 46 and the first roller shaft 42 are both fixed on the second supporting plate 58. The third motor 56 is installed on the seventh rotating shaft 46, and the second copper foil 5 is wound on the third rotating shaft 4. The second copper foil 5 is wound on the seventh rotating shaft 46 after passing through the third rotating shaft 4, the second rotating shaft 13, the first rotating shaft 11, the second roller shaft 41 and the first roller shaft 42 under the driving of the third motor 56. The fifth rotating shaft 21 is located above the deionized water solution in the reaction chamber 9, and the fourth rotating shaft 37 is located in the deionized water solution directly below the fifth rotating shaft 21. The sixth rotating shaft 23 is also arranged on the plane where the fifth rotating shaft 21 is located. The third roller shaft 49 is disposed below the sixth rotating shaft 23. The eighth rotating shaft 50 is disposed on a horizontal right side of the sixth rotating shaft 23, and the fourth roller shaft 40 is disposed below the eighth rotating shaft 50. The eighth rotating shaft 50 and the fourth roller shaft 40 are both fixed on the second supporting plate 58. The fourth motor 57 is installed on the eighth rotating shaft 50, and the first copper foil 22 is wound on the fourth rotating shaft 37. The first copper foil 22 is wound on the eighth rotating shaft 50 after passing through the fourth rotating shaft 37, the fifth rotating shaft 21, the sixth rotating shaft 23, the third roller shaft 49 and the fourth roller shaft 40 under the driving of the fourth motor 50. The distance between the copper foil and the graphite solid target 18 can be adjusted by changing the meshing position of the meshing plate 36 on the rack 35 as needed. A pulsed laser device 26 is disposed above the reaction chamber, and an extender lens 24 is disposed between the pulsed laser device 26 and the spectroscope 20. The laser 25 emitted by the pulsed laser device 26 expands the diameter of the spot through the beam expander 24 and reflects the light through the beam splitter 20 to generate the first laser beam 19 and the second laser beam 17. The first laser beam 19 focused by a focusing lens 15 ablates onto a façade of one side of the graphite solid target 18, and the second laser beam 17 passes through a focusing lens 15 ablates on the façade of the other side of the graphite solid target 18 in the deionized water.

This case also adds a cleaning and drying device. it includes the first reservoir 38, the second reservoir 39, the second solenoid valve 52, the first solenoid valve 44, a water pump 51, a nitrogen bottle 43, and a throttle meter 45. The first reservoir 38 and the second reservoir 39 are connected to the water pump 51 through the second electromagnetic valve 52. There are several liquid nozzles 48 which are above the second copper foil 5 between the first roller shaft 42 and the second roller shaft 41 and above the first copper foil 22 between the third roller shaft 49 and the fourth roller shaft 53. The liquid nozzles 48 are mounted on an output line of the water pump 51. The nitrogen bottle 43 is connected to the throttle meter 45 through the first solenoid valve 44. There are several air nozzles 47 which are on the right side of the second copper foil 5 between the first roller shaft 42 and the seventh rotating shaft 46 and on the left side of the first copper foil 22 between the fourth roller shaft 53 and the eighth rotating shaft 50. Each gas nozzle (47) is mounted on the output gas line of the throttle meter (45).

The third motor 56, the fourth motor 57, the second solenoid valve 52, the first solenoid valve 44, the water pump 51, the moving platform 7 and the throttle meter 45 are connected with a digital controller 28. The digital controller 28 and the pulsed laser device 26 are connected to a computer 27.

The method for preparing graphene by the above device is to place a commercial highly ordered pyrolytic graphite (HOPG) 18 having a purity of 99.99% in the middle of the reaction chamber 9. Fixing by the constraint plate 2 while adjusting the meshing plate 36, so that the distance between the left and right sides of the first copper foil 22 and the second copper foil 5 and the graphite solid target 18 is 2-3 mm. Turn on the pulsed laser device 26, and the laser parameters (laser energy=0.6 J wavelength=532 nm, $\tau$=7 ns) with a spot diameter of 1 mm are set by the computer 27. In addition, the power density of the first laser beam and the second laser beam are both 3.82×109 W/cm2. The laser shock time is 75 min, and the position of the laser head 14 is adjusted so that the laser focus is respectively located on the left and right sides of the graphite solid target 18, which is lower than the liquid surface 3 mm. According to the laser scan path shown in FIG. 4, the relative movement time of the laser in the adjacent two impact center points was set to 0.1 s, so the moving speed of the three-dimensional moving platform in the horizontal direction was set to 0.005 m/s, which ensure that each point was ablated by 10 pulses. When the laser scanned to the boundary of the graphite solid target 18, the third motor 53 and the fourth motor 55 drive the copper foil to rotate 0.5 mm while the moving platform moves in the reverse direction until the shock time is 75 min. Open the water pump and the three-way solenoid valve by the computer. During a period of motion of the stepping motor, the anhydrous ethanol in the first liquid storage tank is sucked to rinse the surface of the substrate through the liquid nozzle at an appropriate flow rate. In the same way, the deionized water in the second liquid storage tank is sucked to rinse the surface of the substrate at an appropriate flow rate. In addition, the two-way solenoid valve and the throttle meter are kept in a normally open state to allow the nitrogen to dry the base surface. Last but not least, turn off all devices, and the copper foil is removed for subsequent graphene purification and transfer processing.

Figure 5:
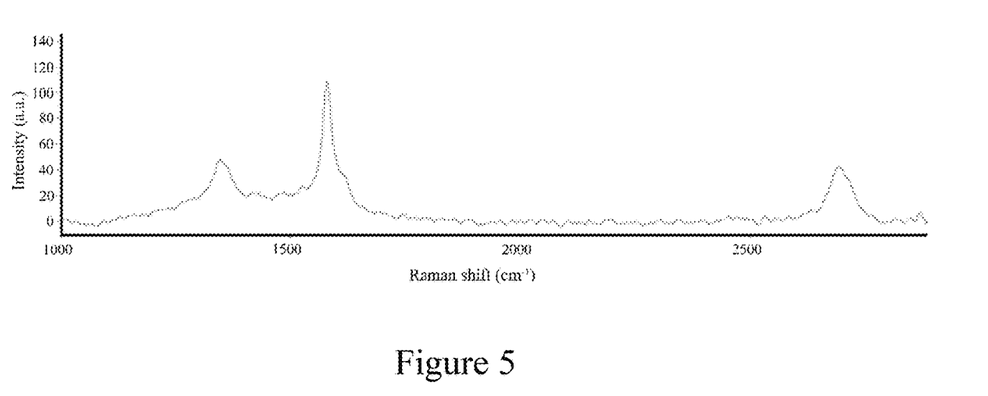
FIG. 5. Typical Raman spectra of the sample ablated with laser energy of 0.6 J.
Figure 6:
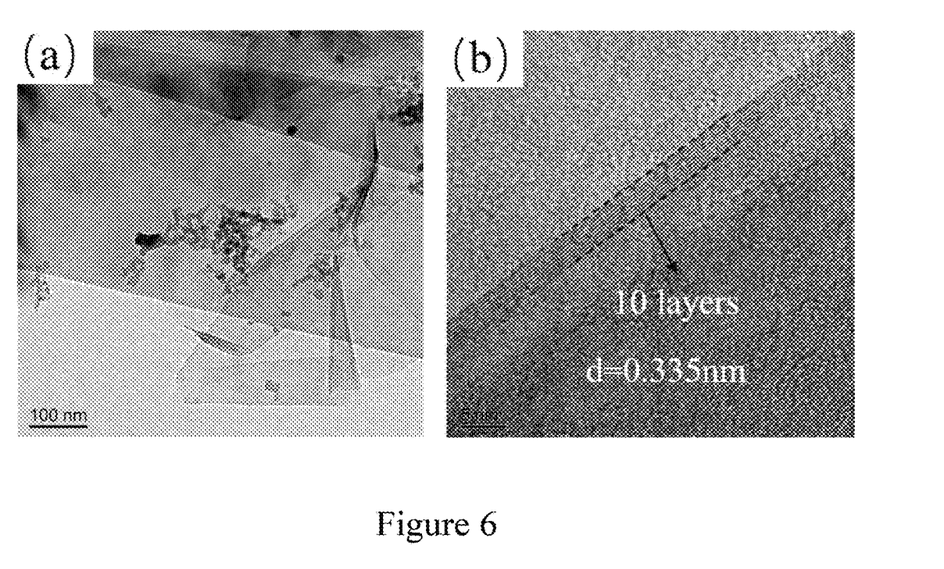
FIG. 6. HRTEM image of the sample ablated with laser energy of 0.6 J.

The Raman spectra and High-resolution transmission electron microscopy are used to characterize the morphology and layer number of samples. The typical Raman spectra of the samples are shown in FIG. 5. The intensities of the three prominent Raman features of graphene are D band which is approximately 1350 cm$^{-1}$, G band around 1580 cm$^{-1}$ and 2D band nearly 2700 cm$^{-1}$. FIG. 6 (a) is HRTEM image of the sample ablated with laser energy of 0.6 J which shows the ultra-thin corrugated and folded stack of graphene layers. FIG. 6(b) is an enlarged view of the selected area in FIG. 6(a). The lattice spacing of the layer-structure is about 0.355 nm, which is close to the spacing (0.356 nm) of {002} planes of graphite. This is confirming the presence of graphene. In addition, the edge of graphene indicates that graphene with 10 layers is prepared.

Finally, it should be noted that the above content is only used to explain the technical solutions of the invention, not to limit the scope of the present invention.

The invention claimed is:

1. A device for preparing graphene by liquid-phase pulsed laser ablation, the device comprising
a moving platform and a reaction chamber which is arranged on the moving platform, a deionized aqueous solution in the reaction chamber, a first group of rotating shafts, a second group of rotating shafts, a first copper foil engaging the first group of rotating shafts, a second copper foil engaging the second group of rotating shafts, and first and second focusing lenses;
the first group of rotating shafts and the second group of rotating shafts being symmetrically arranged inside the reaction chamber;
the first group of rotating shafts including a first rotating shaft, a second rotating shaft, and a third rotating shaft;
the second group of rotating shafts including a fourth rotating shaft, a fifth rotating shaft, and a sixth rotating shaft;
an axis of the first rotating shaft, an axis of the second rotating shaft, an axis of the third rotating shaft, an axis of the fourth rotating shaft, an axis of the fifth rotating shaft, and an axis of the sixth rotating shaft being parallel to each other;
wherein:
the first rotating shaft and the sixth rotating shaft are arranged in opposite directions at a top of the reaction chamber;
the second rotating shaft and the fifth rotating shaft are symmetrically arranged between the first rotating shaft and the sixth rotating shaft, and the first rotating shaft, the second rotating shaft, the fifth rotating shaft, and the sixth rotating shaft are located in a plane;
the third rotating shaft and the fourth rotating shaft are arranged at a bottom of the reaction chamber, the third rotating shaft is located directly below the second rotating shaft, and the fourth rotating shaft is located directly below the fifth rotating shaft;
the reaction chamber has a midregion between the third rotating shaft and the fourth rotating shaft in which a graphite solid target is receivable so that the graphite solid target is located in the deionized aqueous solution in the reaction chamber;
a liquid level of the deionized aqueous solution is lower than the top of the reaction chamber and lower than the first and second focusing lenses and higher than the third rotating shaft and the fourth rotating shaft; and
a pulse laser device is disposed above the reaction chamber.

2. The device according to claim 1, characterized in that
the first copper foil and the second copper foil are symmetrically arranged and each has an L-shape form;
a first end of the first copper foil is attached to the fourth rotating shaft, a second end of the first copper foil is attached to the sixth rotating shaft, a middle portion of the first copper foil passes across and contacts the fifth rotating shaft;
a first end of the second copper foil is attached to the first rotating shaft, a second end of the second copper foil is attached to the third rotating shaft, a middle portion of the second copper foil passes across and contacts the second rotating shaft; and
a laser emitted by the pulsed laser device expands the diameter of the spot through a beam expander and reflects the light through a beam splitter to generate a first laser beam and a second laser beam, the first laser beam is focused by the first focusing lens onto a first side of the midregion of the reaction chamber so as to be operable to ablate a first façade of the graphite solid target when received in the midregion of the reaction chamber, and the second laser beam passes through the second focusing lens onto a second side of the midregion of the reaction chamber so as to be operable to ablate a second façade of the graphite solid target in the deionized aqueous solution when received in the midregion of the reaction chamber.

3. The device according to claim 2, characterized in that two rows of racks are fixed on a bottom surface of the reaction chamber, and the two rows of racks are connected by a constraint plate, the graphite solid target when received in the midregion of the reaction chamber is constrained by the constraint plate, each of the two rows of racks is provided with two meshing plates, and the graphite solid target is located in the middle of the meshing plates when received in the midregion of the reaction chamber, two ends of the third rotating shaft, the second rotating shaft, the fourth rotating shaft, and the fifth rotating shaft are correspondingly mounted on the two rows of racks on the meshing plate.

4. The device according claim 2, characterized in that the reaction chamber is located in a collection chamber located on the moving platform, a water inlet of a circulating electric pump is connected to a bottom of the collecting chamber, a water outlet of the circulating electric pump is connected to a middle of the reaction chamber, and the water outlet of the circulating electric pump is provided with a liquid storage tank and a flow meter.

5. The device according to claim 4, characterized in that a first motor and a second motor are installed on the first rotating shaft and the sixth rotating shaft, respectively, the first motor, the second motor, the circulating electric pump, the moving platform and the flow meter are connected with a digital controller, and the digital controller and the pulsed laser device are connected to a computer.

6. The device according to claim 4, characterized in that four magnets are disposed between the collection chamber and the reaction chamber, and the graphite solid target is located in the middle of the four magnets when received in the midregion of the reaction chamber.

7. The device according to claim 1, characterized by first and second roller shafts wherein the second roller shaft is disposed below the first rotating shaft, and the first roller shaft is disposed on a horizontal surface of the second roller shaft, a seventh rotating shaft is disposed above the first roller shaft, the second copper foil is wound on the seventh rotating shaft, sequentially passing through the third rotating shaft, the second rotating shaft, the first rotating shaft, the second roller shaft and the first roller shaft, a plurality of air nozzles are disposed on a first side of the second copper foil, which is located between the first roller shaft and the seventh rotating shaft, a plurality of liquid nozzles are disposed above the second copper foil, which is located between the first roller shaft and the second roller shaft.

8. The device according to claim 7, characterized in that a third roller shaft is disposed below the sixth rotating shaft, a fourth rover shaft is disposed on a horizontal plane of the third roller shaft, an eighth rotating shaft is disposed above the fourth rover shaft, a first end the first copper foil is attached to the fourth rotating shaft, a second end of the first copper foil is attached to the eighth rotating shaft, the first copper foil sequentially passing across the fourth rotating shaft, the fifth rotating shaft, the sixth rotating shaft, the third roller shaft and the fourth roller shaft, the plurality of liquid nozzles are disposed above the first copper foil between the third roller shaft and the fourth roller shaft, the plurality of aft nozzles are disposed on a second side of the first copper foil between the eighth rotating shaft and the fourth roller shaft, a laser emitted by the pulsed laser device expands the diameter of the spot through a beam expander and reflects the light through a beam splitter to generate a first laser beam and a second laser beam, the first laser beam is focused by the first focusing lens onto a first side of the midregion of the reaction chamber so as to be operable to ablate a first facade of the graphite solid target when received in the midregion of the reaction chamber, and the second laser beam passes through the second focusing lens onto a second side of the midregion of the reaction chamber so as to be operable to ablate a second facade of the graphite solid target in the deionized aqueous solution when received in the midregion of the reaction chamber.

9. The device according claim 7, characterized in that the device includes a first reservoir, a second reservoir, first and second solenoid valves, a water pump, a nitrogen bottle, and a throttle meter, the first reservoir and the second reservoir are connected to the water pump through the second solenoid valve, the nitrogen bottle is connected to the throttle meter through the first solenoid valve, the plurality of liquid nozzles are mounted on an output line of the water pump, and the plurality of air nozzles are mounted on an output gas line of the throttle meter.

10. The device according to claim 9, characterized in that a motor is mounted on an eighth rotating shaft, another motor is disposed on the seventh rotating shaft, the motors, the second solenoid valve, the first solenoid valve, the water pump, the moving platform and the throttle meter are all connected to a digital controller, and the digital controller and the pulsed laser device are connected to a computer.

\* \* \* \* \*